United States Patent [19]

Caldwell et al.

[11] Patent Number: 5,151,661
[45] Date of Patent: Sep. 29, 1992

[54] DIRECT DIGITAL FM WAVEFORM GENERATOR FOR RADAR SYSTEMS

[75] Inventors: Stephen P. Caldwell; Thomas D. Merrell, Jr., both of Columbia, Md.

[73] Assignee: Westinghouse Electric Corp., Pittsburgh, Pa.

[21] Appl. No.: 749,790

[22] Filed: Aug. 26, 1991

[51] Int. Cl.$^5$ .................... H03B 19/00; H03D 13/00
[52] U.S. Cl. ...................... 328/14; 328/16; 307/529
[58] Field of Search .................. 307/529; 328/14, 15, 328/16, 18; 345/62; 370/110.2; 364/718, 719, 851, 852

[56] References Cited

U.S. PATENT DOCUMENTS 4,625,177  11/1986  Conway et al. ............ 328/14
4,926,130   5/1990  Weaver ................... 328/14
5,028,887   7/1991  Gilmore .................. 328/14

OTHER PUBLICATIONS

"A Direct Digitally Synthesized Exciter Achieving Near Theoretical Performance for an Operational SAR Systems" Gallaway et al., 1988 IEEE.
"Model 2040 800 Npoint/s Polynomial Waveform Synthesizer", Analogic Product Data Sheet, 1989.
"32-bit DDS Phase Accumulator, 1.0 GHz Clock Rate", GaAs IC data book and designers catalog, Gigabit, 1988, pl. 153.
"Model TW6112 8 bit, 1 GHz DAC", Triquint Data Sheet, 1987.
"STEL-2173 1 GHz 32-bit GaAs MNCO", Integrated Circuits Frequency Synthesis Products data sheet.

*Primary Examiner*—Stanley D. Miller
*Assistant Examiner*—Sinh N. Tran
*Attorney, Agent, or Firm*—D. G. Maire

[57] ABSTRACT

A linear FM waveform generator employs direct digital synthesis and includes a digital linear FM signal generator, a digital-analog converter, and a sampler means. The linear FM waveform generator includes a frequency slope register coupled to a first stage integrator which in turn is coupled to a second stage integrator, all of which operate off a system clock. The output signal from the second stage integrator represents phase as a quadratic function of time. A stored sine look-up table is referenced to generate an output digital signal representing amplitude as a function of time. The output digital signal is converted to an analog linear FM waveform which in turn is coupled to a sampler that includes a step recovery diode and a fast switch. The sampler aperture is sufficiently small that the sampler output linear FM waveform includes base and higher harmonic spectra with amplitude attenuation small enough to enable a third or higher harmonic spectra to be used for generation of the output linear FM waveform. The sampler output is filtered to pass a higher harmonic spectra which is directly coupled to output multiplication and filter circuitry.

10 Claims, 3 Drawing Sheets

DIRECT DIGITAL FM WAVEFORM GENERATOR FOR RADAR SYSTEMS

BACKGROUND OF THE INVENTION

The present invention relates to FM waveform generators and more particularly to direct digital FM waveform generators used to provide high range resolution in radar systems.

FM waveform generators produce a waveform having a frequency that varies from a start value to a stop value over the time span of each radar pulse transmitted for target detection. The variation of frequency with time is substantially linear to enable high range resolution to be achieved. With high range resolution, target distance is more accurately detected. It is useful in synthetic aperture radar and inverse synthetic aperture radar and in target identification modes.

Generally, the following equation defines range resolution:

$$\Delta r = kc/2B$$

where: $\Delta r$ = range resolution
$c$ = speed of light
$B$ = bandwidth of linear waveform
$k$ = weighting factor (approximately 1.2)

With greater FM bandwidth, namely with greater span between the start and stop frequencies, range resolution is made smaller to provide more accurate distance detection. For example, the range resolution can be approximately one foot for an FM bandwidth of 600 MHz.

The ideal linear FM waveform has quadratic phase. Errors in the waveform phase cause the FM waveform frequency to deviate from a linear variation. If the phase error is too great, false range responses, or excessive range sidelobes, are generated in the presence of a large range response. A phase error less than one to two degrees is normally required for sidelobe amplitudes below −35 dBc.

Waveform phase varies as a function of time in accordance with the following equation:

$$d\Phi/dt = 2\pi f$$

$$\Phi = \int 2\pi f dt = \int 2\pi kt dt \text{ where } k = \text{linear FM slope [Hz/sec]}$$

$$\Phi = t^2 \times \pi k = \pi k t^2$$

A phase error can occur at any point in the time along the FM waveform where the actual $\Phi$ differs from $\Phi$ calculated in accordance with the above equation.

Linear FM waveform parameters, especially useful to imaging radars, are starting phase of the linear FM waveform, frequency offset, and linear FM slope. If these parameters are programmable and precisely controllable, hardware complexity is reduced in imaging radars.

A first technique for achieving a linear FM waveform with wide bandwidth and good range sidelobes (< −35 dB) uses a sampled phase-locked loop, as disclosed for example in U.S. Pat. No. 4,160,958. The sampled phase-locked loop provides excellent range sidelobe performance at bandwidths up to 1 GHz.

Linear FM waveforms can also be generated by a direct digital synthesis (DDS) technique. With the use of GaAs logic and digital-to-analog converters (DACs), bandwidths up to 600 MHz or more are feasible with DDS. Recent literature on this subject includes the following:

1. "A direct digitally synthesized exciter achieving near theoretical performance for an operational SAR system", Gallaway et. al., 88CH2572-6/88/0000-0022 1988 IEEE.
2. "Model 2040 800 Mpoint/second polynominal waveform synthesizer." Analogic product data sheet. 1989.
3. "32-bit DDS Phase Accumulator, 1.0 GHz clock rate." GaAs IC data book and designers Catalog. Gigabit. 1988. p1-153.
4. "Model TQ6112 8 bit, 1 GHz DAC". Triquint Data Sheet. 1987.

DDS has several advantages when compared to the phase-locked loop approach: 1. reduced hardware complexity; 2. faster waveform reset time; and 3. larger linear FM slopes. The significance of these advantages varies according to the radar application.

The typical prior art DDS FM waveform generator employs digital circuitry to generate a linear FM waveform that drives a DAC. The digital circuitry normally is either a programmable read only memory (PROM) which has stored samples of the waveform, or a phase accumulator and PROM which generate the waveform in real time. The waveform output from the DAC is smoothed by filtering and then frequency offset to the microwave range in one or more mixer stages, each having output filtering that rejects unwanted mixer products. Finally, the frequency offset waveform is frequency multiplied to generate the output linear FM waveform.

The FM bandwidth generated at the DAC output is limited to the Nyquist frequency which equals one half of the clock rate in accordance with Nyquist sampling theory. The DAC output is a staircase approximation to the desired linear FM waveform, and it includes periodic higher frequency extensions. An ideal or "brickwall" low-pass filter would remove undesired higher frequency spectra, but the use of real filters results in a tradeoff between the maximum generated bandwidth and the attenuation of the desired and undesired spectra.

Actual low-pass filters also introduce phase errors on the linear FM waveform that can further reduce bandwidth. The additional circuitry after the low-pass filter for mixing, filtering and frequency multiplication expand the linear FM bandwidth beyond that obtainable at the maximum clock rate of the DDS generator. The added mixing and filtering circuitry contribute to circuit complexity and introduce more phase error.

The present invention is directed to a DDS FM waveform generator having simpler more economic circuit structure that operates with reduced phase error and provides other improved features thereby enabling better radar system performance including higher radar resolution and greater radar reliability.

SUMMARY OF THE INVENTION

A linear FM waveform generator includes means for generating a digital linear FM signal and for converting the digital FM signal to an analog linear FM waveform. The analog FM waveform is coupled to sampling means which generates a linear FM waveform with a relatively elevated frequency span that can be directly employed for generation of an output linear FM waveform.

BRIEF DESCRIPTION OF THE DRAWINGS

The accompanying drawings, which are incorporated in and constitute a part of this specification illustrate one embodiment of the invention and together with the description provide an explanation of the objects, advantages and principles of the invention. In the drawings.

DESCRIPTION OF THE PREFERRED EMBODIMENT

Figure 1:
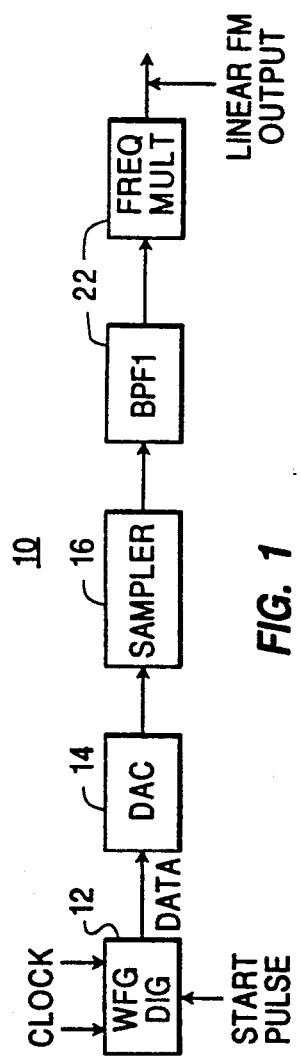
FIG. 1 shows a functional block diagram for a DDS linear FM waveform generator arranged in accordance with the principles of the invention.

A wideband linear FM waveform generator 10 shown in FIG. 1 is arranged in accordance with the principles of the invention. Means 12 are provided for generating a linear FM waveform that is applied to means 14 for converting digital signals to analog signals. The FM waveform generator means 12 is preferably embodied as circuitry shown in FIG. 2. The means 14 may be any suitable commercially available digital-to-analog converter device such as a Triquint 8-bit unit.

Figure 2:
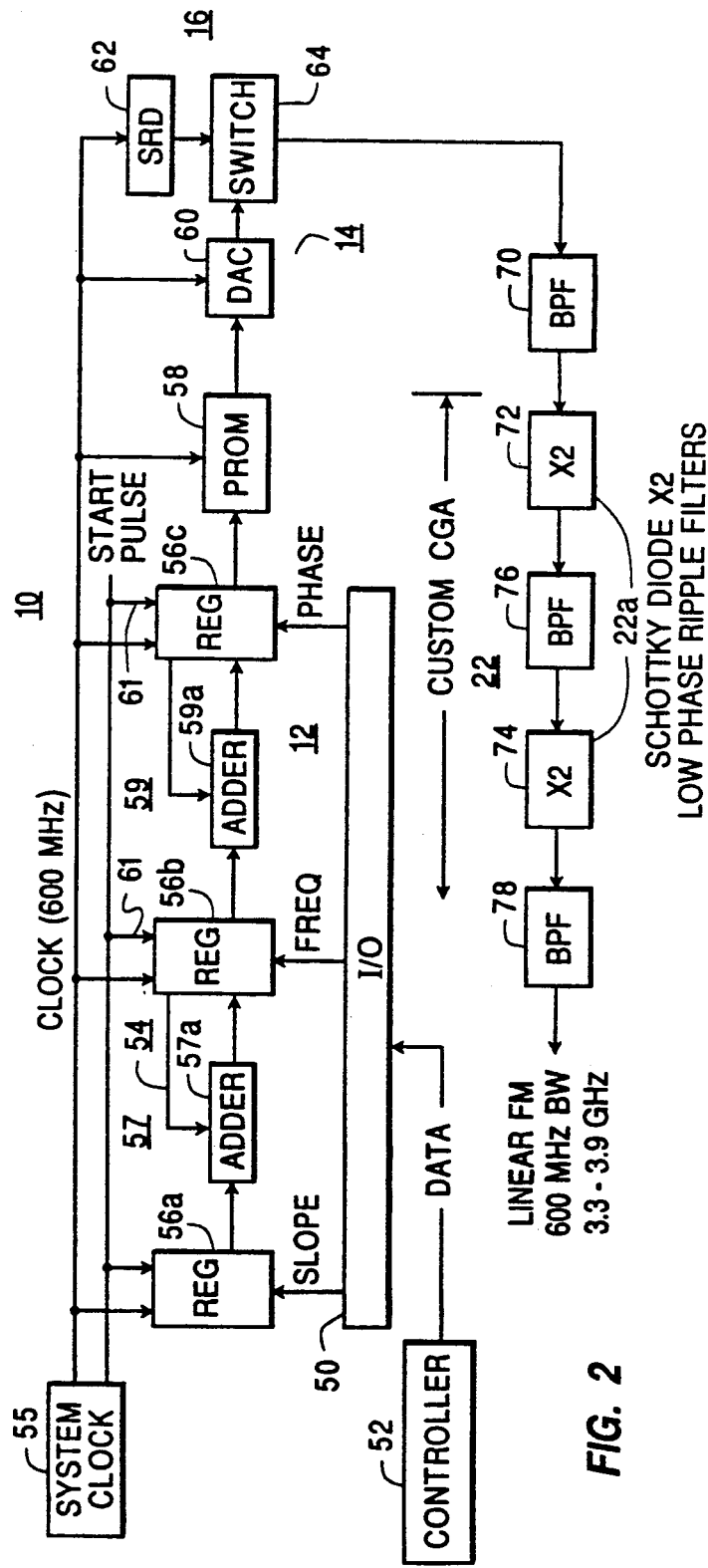
FIG. 2 shows a more detailed diagram of the generator shown in FIG. 1.
Figure 3A:
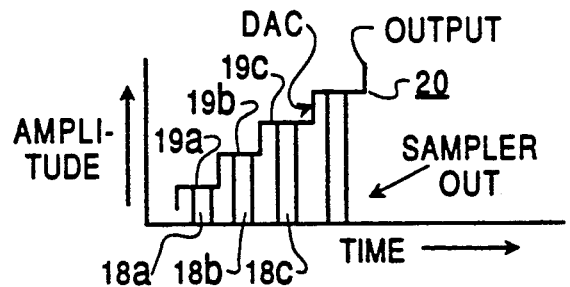
FIG. 3A shows a portion of a DAC output waveform and a sampler output derived therefrom in accordance with the invention.

The DAC output waveform is applied to sampler means 16 which is preferably structured as a high speed switch 64 as shown in FIG. 2. As shown in FIG. 3A, the sampler means 16 is periodically switched "on" to generate sample output segments 18a, 18b, 18c, etc. from each respective step 19a, 19b, 19c, etc. during successive clock periods in a DAC staircase output waveform 20.

The sampler output need not be frequency upconverted but instead is directly coupled to circuit means 22 for filtering and multiplying the waveform to its output configuration. Cascaded doubler multiplication with associated filtering is preferred for the circuit means 22, as considered more fully in connection with FIG. 2.

Overall, the DDS FM waveform generator 10 has reduced circuit complexity and improved phase error performance along with other improvements explained more fully hereinafter.

Figure 4:
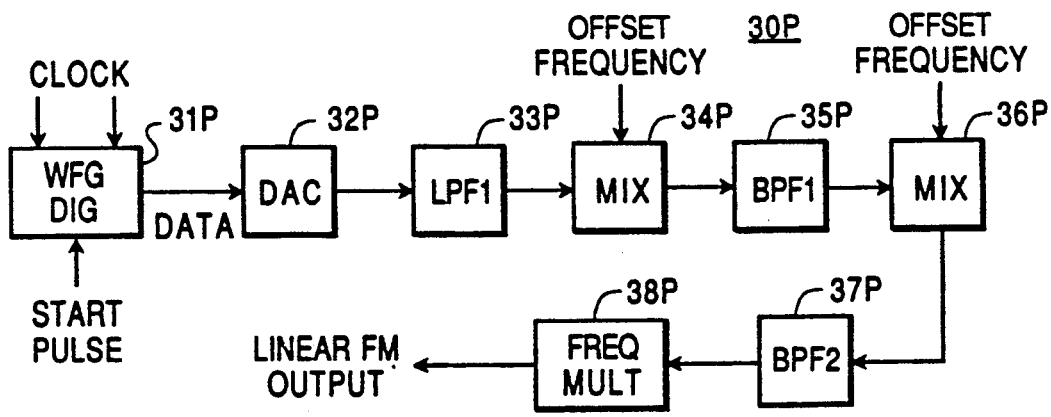
FIG. 4 shows a functional block diagram of a typical prior art DDS FM waveform generator.

In FIG. 4, there is shown a typical prior art DDS FM waveform generator 30P to which reference was made previously herein. A digital waveform generator 31P applies its FM waveform output to a DAC 32P. The DAC output is applied to a low pass filter 33P which in turn is coupled along with an offset frequency to a first stage mixer 34P. Desired mixer products are passed to another mixer 36P in a second cascaded mixer stage by a band pass filter 35P. Finally, a band pass filter 37P passes desired mixer products to a frequency multiplier 38P which generates the output FM waveform with linearity subject to deviation caused by phase error.

Figure 5:
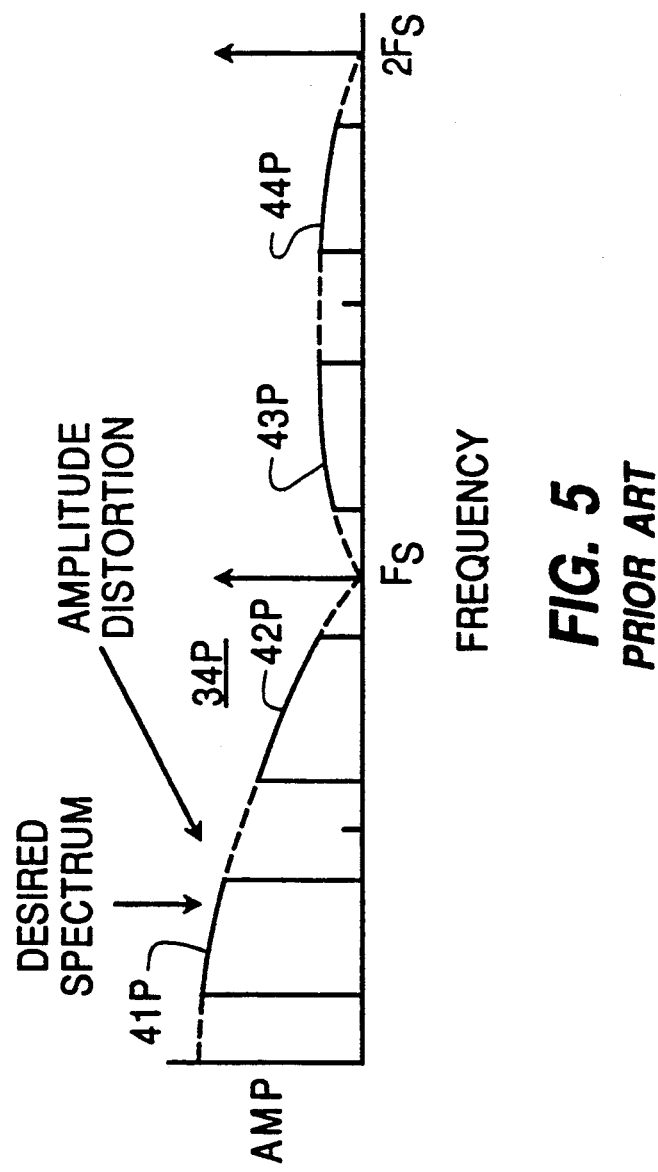
FIG. 5 illustrates the amplitude distortion produced in higher frequency spectra of the DAC output waveform in the prior art generator of FIG. 4.

As previously indicated, the nonexistence of "brickwall" low pass filters results in a prior art tradeoff between the maximum generated bandwidth and the attenuation of desired and undesired spectra. FIG. 5 shows a prior art FM output waveform 34P generated at the output of the DAC 32P.

As shown, a first spectrum 41P of the generated waveform 34P is the waveform portion that is further processed for final output, but it has undesired, although tolerable, amplitude attenuation over its frequency span. Further, periodic extensions or higher harmonic spectra 42P, 43P, and 44P have much greater amplitude attenuation. As a result, only the first and lowest spectrum 41P is usable for further processing in the prior art, and upconverting with mixer circuitry is necessary to generate an output FM waveform having the desired frequency span.

In addition, the actual low pass filter 33P introduces phase errors that add nonlinear deviations to the FM waveform. Accordingly, to the extent that bandwidth is traded down, and further to the extent that prior art mixer/filter circuitry introduces phase error, radar range sidelobes are relatively increased with use of the prior art FM waveform generator 30P.

Mixing, filtering and frequency multiplication are needed in the prior art to expand the FM bandwidth beyond that obtainable at the maximum clock rate for the DAC 32P and for logic circuitry in the digital waveform generator 31P. However, such circuitry characterizes the prior art with circuit complexity that generally increases costs and reduces reliability.

With reference again to the present invention, the wideband linear FM generator 10 is shown with greater functional block detail in FIG. 2. The various circuit means shown in FIG. 1 preferably are embodied in accordance with the structural arrangement shown in FIG. 2.

The digital FM waveform generator means 12 accordingly includes an input/output section 50 that is interfaced with a controller 52. Input data supplied by the controller 52, in the form of digital word signals, includes a desired linear FM waveform slope, an FM waveform starting frequency, and an FM waveform starting phase.

An accumulator 54 is employed to generate a linear FM waveform, as opposed to a PROM approach, because it provides the multitude of linear waveforms required in advanced SAR/ISAR systems. The accumulator 54 is basically a two-stage integrator that creates a quadratic phase output under time control from a system clock 55. A quadratic phase output is one in which the phase $\Phi$ varies as a function of time squared.

The accumulator 54 is characterized with a predetermined number of bits N used for signal processing in its registers 56a, 56b, and 56c. The number of bits employed depends on specific radar requirements, and often thirty to forty bits may be the number used. Generally, finer resolution of linear FM slope, starting frequency, and phase is provided by higher values of N.

The register 56a applies a constant output value to a first stage integrator 57 that includes the register 56b and an adder 57a. The output value from the register 56a represents the specified linear FM waveform slope df/dt as defined by the input slope data signal from the input/output section 50.

The data input signal for the FM waveform starting frequency is applied to the integrator register 56b as an initial register value thereby defining the starting point of the output of the register 56b. Once a system start pulse 61 is generated by the system clock 55, the register 56a generates its output phase value (linear slope for the ultimate output frequency waveform) and the first stage register 56b and the second stage register 56C begin integrating operation.

In the integration process during the first clock cycle, the adder 57a adds the value from the register 56a to a digital feedback signal from the register 56b representing its initial value. The sum is a phase value that is stored as an integration result for the first clock cycle in the register 56b and further is applied as an output to the second stage integrator 59.

In the next clock cycle, the new stored phase value in the first stage register 56b is added to the constant value from the register 56a and the sum is another higher phase value stored as an accumulated integration result for the first two clock cycles in the register 56b. This discrete time addition and register accumulation process repeats with each clock cycle and accordingly constitutes a time integration process applied to the input value of df/dt.

In turn, the output of the first stage integrator 57 is applied to the input of the second stage integrator 59 which includes the register 56c and an adder 59a. A time integration process like that just described is performed by the second stage integrator 59 on the output from the register 56b. In this process, adder 59a adds, during each clock cycle, the current phase output value from the register 56b to the currently stored phase value in the register 56c.

The output from the register 56c is the output of the accumulator 54. It is a varying digital signal that represents phase Φ as a function of time and specifically as a quadratic function of time because of the cascaded two-stage time integration process.

The quadratic phase function from the accumulator 54 is referenced to a sine look-up table stored in the PROM 58 to convert phase Φ to an amplitude thereby producing a digital output signal in real time that is a linear FM waveform in digital form. The linear digital FM signal is coupled to the input of the DAC 60 for conversion to an analog waveform.

Achievable resolution by the accumulator 54 for the waveform slope, frequency and phase is defined by the following equations:

$$\Delta \Phi = \frac{360}{2^N} * M = \text{phase resolution (degrees)}$$

$$\Delta f = \frac{F_s}{2^N} * M = \text{frequency resolution (Hz)}$$

$$\Delta k = \frac{F_s}{2^N} * M \, \Delta k = \text{slope resolution (Hz/sec)}$$

$F_s$ = accumulator clock frequency $M$ = frequency multiplication following DAC The accumulator 54 and the sine look-up PROM 58 are preferably formed as a single integrated gallium arsenide or bipolar emitter coupled logic (ECL) circuit (not specifically shown). The portion of the integrated circuit (IC) chip for the PROM 58 is suitably structured like conventional sine look-up PROM chips such as a Stanford Telecom device STEL-2173, and each integrator stage is provided with suitable structure in the same IC chip such as that provided for the commercially available single stage integrator within the STEL-2173.

The digital signal output of the PROM 58 is applied to the input of the DAC 60. In turn, the DAC 60 generates the analog staircase waveform 20 of FIG. 3A.

The sine look-up PROM 58 and the DAC 60 are also characterized with a predetermined number of bits for signal processing. An 8-bit DAC may be employed to achieve better than −35 dB range sidelobes with frequency multiplication equal to four. The PROM 58 is preferably structured with one additional bit to minimize quantization errors.

If an 8-bit GaAs Triquint DAC or its equivalent is employed, output samples can occur at a rate of 1 GHz. A 12-bit version of the DAC will support better range sidelobes as a result of higher resolution.

The DAC analog output waveform is applied to the sampler 16 which provides a switch function needed to gate successive waveform samples. Preferably, the sampler 16 includes a step recovery diode 62 (SRD), such as a Hewlett Packard 33000 Series device, which operates off the clock 55 to drive a fast switch 64, such as a Watkins-Johnson Schottky diode switch, and thereby define a gating aperture for the DAC output signal. The sampler 16 essentially operates as a high speed switch with the required gating aperture determined by the maximum frequency of the particular spectrum that will ultimately be used in generating the linear output FM waveform.

With Gaussian pulse widths and a selected spectra having its maximum frequency with less than 3 dB attenuation relative to the base spectra amplitude, the following equation defines the required sampling aperture:

$$\text{Sampler Aperture} = A = \frac{.66}{2 * F_{ddsmax}}$$

Fddsmax = maximum frequency desired spectrum

For a 600 MHz clock rate and use of the third harmonic spectra, a sampler with a 400 pico-second aperture is employed. The SRD 62 and switch 64 produce a 400 pico-second or shorter sampling aperture. The aperture is controlled by the pulsewidth of the SRD output, which is fixed by inductor, capacitor, resister network internal to the SRD.

Figure 3B:
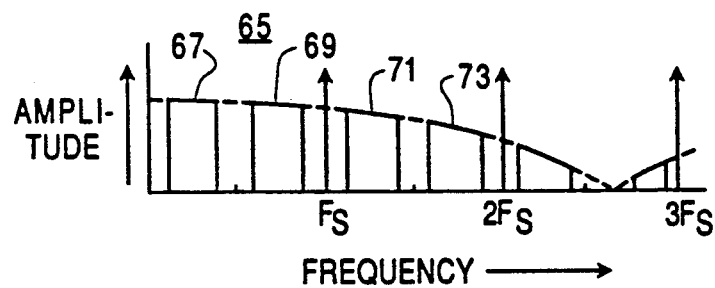
FIG. 3B illustrates the significantly reduced amplitude distortion of higher frequency spectra achieved by the invention.

As shown in FIG. 3B, the sampled DAC output waveform, with the sampler aperture employed in the preferred embodiment, has a frequency profile 65 that includes a first or base spectrum 67 and higher harmonic spectra 69, 71, 73, etc. that are odd harmonics of one fourth of the clock frequency. In this preferred case, the highest illustrated spectra are somewhat attenuated, but with shorter sampler gating apertures such spectra and higher spectra not illustrated have increasingly less attenuation as explained hereinafter. An aperture less than 400 pico-second gives less than 1 dB spectrum variation from 675 to 825 MHz. This compares to 1.9 dB for conventional 75 to 225 MHz.

The base spectrum 67 preferably has a frequency span with ¼ of the clock frequency at its center. The spectrum 71 is a third harmonic having a frequency span with 5/4 of the clock frequency at its center, and it is the spectrum employed in the preferred embodiment for further processing that leads to the generation of the linear FM output waveform of the waveform generator 10. Generally, in operating the waveform generator 10, one of the spectra is preselected for output FM waveform generation and the balance of the spectra are blocked from output processing.

The amplitude attenuation of the maximum frequency of the base spectra 67 is very low as compared to the prior art. Similarly, the attenuation of each higher spectra as a whole is significantly less than that of the prior art.

In fact, since the width of the step in the DAC staircase waveform 20 determines the attenuation or rolloff of the amplitude of each spectra in accordance with sinx/x, the attenuation can be restricted virtually to the extent desired by decreasing the gating aperture of the sampling means 16. In turn, this aspect of the invention enables the use of higher harmonic spectra that can be directly processed by output filtering and multiplication circuitry without upconverting thereby reducing circuit complexity and reducing phase error.

It is also noteworthy that each higher harmonic spectrum has progressively lower % bandwidth ($\Delta f/f$) since $\Delta f$ is the same for all spectra and the center frequency f increases with each successive spectrum. Spectra with lower percentage bandwidth provide design and operating advantages since phase error performance improves with increasing distance of harmonic frequencies (that are to be rejected) from bandpass filter cutoff frequencies.

In the preferred embodiment, the sampler output is a linear FM waveform with a 20% bandwidth. As previously indicated, the use of shorter sampler gating apertures will provide even lower percentage bandwidths.

To extend the output bandwidth or to reduce the clock rate for an existing output bandwidth, the linear FM waveform is coupled through an input bandpass filter 70 in the multiplication and filter circuit means 22. The filter 70 passes a selected spectra, the third harmonic in the preferred embodiment, for output processing, and it rejects other spectrum. The filter 70 preferably is characterized to produce low phase error. In the preferred embodiment, radar system phase error contributions from the filter 70 can be less than $\frac{1}{2}$ degree. Butterworth or Bessel filters are suitable for the filter 70.

Preferably, the circuit means 22 includes a cascaded two stage multiplier/filter circuit 22a. First and second stage multipliers 72 and 74 are preferably doublers which operate without excessive distortion since the doubler feed-through frequencies and harmonics are relatively far removed from the desired signal. The number of cascaded multipliers and the order(s) of the multipliers are determined from case to case according to particular design parameters and according to how much phase error or distortion is produced by the employed multiplier(s) and how much bandwidth is needed in the application. Higher order multipliers are generally less preferable.

Bandpass filters 76 and 78 provide outputs from the successive multiplier stages. The phase error contributions of filters are minimized by choosing filters with "smooth" phase responses and operating them (i.e. passing frequencies thru them) as far as possible below the filter band edges. A conventional plot of Butterworth normalized responses shows the reason for this. Near band edges (r=1), the group delay, hence phase which is $$\frac{d\Phi}{dw} = \frac{1}{2\pi} \frac{d\Phi}{df},$$

starts to deviate. Chebycheff filters are not good in this regard, with ripples over more of the passband.

Frequency doublers are preferred over higher order frequency multipliers since the harmonies of frequency doublers are easier to filter (i.e., further from r=1) than the harmonies of higher order multipliers. Doublers therefore have lower phase errors.

The use of a higher harmonic spectra as the source of the linear FM output waveform advantageously relaxes multiplier filter requirements in addition to producing a higher frequency output with a reduced percentage bandwidth. However, the advantages of the use of a higher harmonic spectra are traded against reduced sampler output caused by the reduced sampler gating aperture required for the higher harmonic spectra.

In summary, by coupling the sampler 16 to the DAC FM waveform generator, complexity is reduced and improved phase error performance is achieved. Sampling results in enhanced amplitudes for the higher harmonic spectra. As the sampling aperture approaches zero, the baseband spectrum is repeated at equal amplitudes approaching infinite frequency. The higher order spectra can thus be used directly to generate the output linear FM waveform with multiplication but without the complexity and phase error generation of mixing stages otherwise required in the prior art for frequency upconverting.

Specifically, phase errors associated with additional mixer-stage bandpass filters are eliminated by the present invention. The prior art bandpass filter 35P in FIG. 4 is especially prone to produce phase error since its shape factor is normally relatively low to obtain as much bandwidth as possible from the DAC 32P.

With a DDS waveform generator structured i accordance with the present invention, it is capable of providing wideband performance with improved phase error and therefore better range sidelobes in radar systems. A linear FM bandwidth equal to at least 600 MHz can be obtained with better than −35 dBc range sidelobes. Linear slopes can exceed 60 MHz per micro-second which is five to ten times better than that achievable with phase locked loop waveform generators. Such slopes are needed for imaging radar modes that operate with low pulse widths and high bandwidths.

The slope achievable by the waveform generator 10 of the present invention is limited only by distortion due to transient responses in the filtering of the DAC output. For example, a filter 150 MHz wide has a transient time of about 7 nanoseconds. With negligible distortion for pulse widths 100 times the transient response, slopes as high as 600 MHz/0.7 microseconds=857 MHz/microsecond are possible.

In addition, better reset times are achieved by the present invention. The waveform reset time is the time it takes for the waveform generator to start a waveform as measured from the time the last waveform was completed. The waveform generator 10 can achieve reset times much less than one microsecond since the reset time is limited only by the logic which is clocked every 1.67 nsec (a 600 MHz rate) in the preferred embodiment. Fast reset time allows a single waveform generator to be used for the transmit and receiver local oscillator in stretch imaging radars. The single waveform generator is switched from trasmit to receiver after the transmit signal is transmitted. Fast reset time also allows the same waveform generator to produce a LO waveform for the deramp in stretch radars.

Various modifications and variations can be made in the improved direct digital FM waveform generator for radar systems of the present invention by those skilled in the pertaining art without departing from the scope and spirit of the invention. It is accordingly intended that the present invention embrace such modifications and variations to the extent they come within the scope of the appended claims and their equivalents.

What is claimed is:

1. A linear FM waveform generator employing direct digital synthesis, said generator comprising:
    clock means for generating system clock signals at a predetermined frequency;
    means driven by said system clock signals for generating a linear digital FM signal;
    means clocked by said clock means for converting said linear digital FM signal to a linear analog FM waveform;
    sampler means clocked by said clock means for sampling said linear analog FM waveform to generate a sampler linear analog FM waveform that can be directly employed for generation of an output linear FM waveform;
    means for filtering said sampler linear analog FM waveform; and
    means for multiplying said filtered sampler linear analog FM waveform to generate an output linear FM waveform,
    wherein said linear digital FM signal generating means includes a first register generating a constant value representing the slope of the linear FM waveform, a first integration stage having a second register and a first adder coupled to the output of said first register, said second register generating a digital output representing frequency as a function of time, a second integration stage having a third register and a second adder coupled to the output of said second register, said third register generating a digital output representing phase as a function of the square of time, and means for generating in response to the digital output from said third register a digital signal representing amplitude as a function of time and corresponding to said linear digital FM waveform that is coupled to said converting means for conversion to an analog waveform.

2. A linear FM waveform generator employing direct digital synthesis, said generator comprising:
    clock means for generating system clock signals at a predetermined frequency;
    means driven by said system clock signals for generating a linear digital FM signal;
    means clocked by said clock means for converting said digital FM signal to a linear analog FM waveform;
    sampler means clocked by said clock means for sampling said linear analog FM waveform to generate a sampler linear analog FM waveform that can be directly employed for generation of an output linear analog FM waveform;
    means for filtering said sampler linear analog FM waveform; and
    means for multiplying said filtered sampler linear analog FM waveform to generate an output linear FM waveform, wherein said sampling means includes a fast switch driven by means for determining a gating aperture of said sampler means to provide an analog linear FM waveform.

3. The linear FM waveform generator of claim 2 wherein said gating aperture determining means includes a step recovery diode.

4. The linear FM waveform generator of claim 2 wherein said gating aperture determining means produces a gating aperture that enables a third or higher harmonic spectra to be used for generation of the output linear FM waveform.

5. The linear FM waveform generator of claim 4 wherein said filtering means passes said third or higher harmonic spectra and rejects other spectra.

6. A linear FM waveform generator employing direct digital synthesis, said generator comprising:
    clock means for generating system clock signals at a predetermined frequency;
    means driven by said system clock means for generating a linear digital FM signal;
    means clocked by said clock means for converting said digital FM signal to a linear analog FM waveform;
    sampler means clocked by said clock means for sampling said linear analog FM waveform to generate a sampler linear analog FM waveform that can be directly employed for generation of an output linear analog FM waveform;
    means for filtering said sampler linear analog FM waveform; and
    means for multiplying said filtered sampler linear analog FM waveform to generate an output linear FM waveform, wherein said multiplying means includes at least two cascaded multiplying stages, and each of said multiplying stages has an output filter.

7. The linear FM waveform generator of claim 6 wherein each of said multiplying stages includes a frequency doubler having a stage input and having an output coupled to said output filter in its multiplier stage.

8. The linear FM waveform generator of claim 4 wherein said multiplying means includes at least two cascaded multiplying stages, and each of said multiplying stages has an output filter.

9. The linear FM waveform generator of claim 8 wherein each of said multiplying stages includes a frequency doubler having a stage input and having an output coupled to said output filter in its multiplier stage.

10. The linear FM waveform generator of claim 1 wherein means are provided for initializing said first, second and third registers respectively with a slope value, a starting frequency value and a starting phase value.

* * * * *